(12) United States Patent
Chao et al.

(10) Patent No.: US 9,391,291 B2
(45) Date of Patent: *Jul. 12, 2016

(54) ORGANIC LIGHT EMITTING DIODE DISPLAY DEVICE AND DISPLAY PANEL THEREOF

(71) Applicant: Innolux Corporation, Miao-Li County (TW)

(72) Inventors: Kuang-Pin Chao, Miao-Li County (TW); Chien-Tzu Chu, Miao-Li County (TW); Min-Yu Hung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/807,915

(22) Filed: Jul. 24, 2015

(65) Prior Publication Data

US 2015/0325808 A1 Nov. 12, 2015

Related U.S. Application Data (63) Continuation of application No. 14/057,268, filed on Oct. 18, 2013, now Pat. No. 9,123,910.

(30) Foreign Application Priority Data

Nov. 20, 2012 (CN) .......................... 2012 1 0472034

(51) Int. Cl.
  *H01L 29/08* (2006.01)
  *H01L 51/52* (2006.01)

(52) U.S. Cl.
  CPC ............ *H01L 51/5221* (2013.01); *H01L 51/52* (2013.01); *H01L 51/5212* (2013.01);

(Continued)

(58) Field of Classification Search
  CPC ..................... H01L 51/0545; H01L 51/0036
  See application file for complete search history.

(56) References Cited

U.S. PATENT DOCUMENTS 6,794,061 B2 9/2004 Liao et al.
7,061,175 B2 6/2006 Weaver et al.
(Continued)

FOREIGN PATENT DOCUMENTS

CN 102693999 A 9/2012
TW I327159 7/2010
(Continued)

OTHER PUBLICATIONS

EP Search Report dated Feb. 10, 2014.
(Continued)

*Primary Examiner* — Fernando L Toledo
*Assistant Examiner* — Neil Prasad
(74) *Attorney, Agent, or Firm* — McClure, Qualey & Rodack, LLP (57) ABSTRACT

An organic light emitting diode (OLED) display device and a display panel thereof are provided. The organic light emitting diode display panel comprises a first substrate, a first electrode, an organic light emitting layer, a second electrode, and a second substrate. The first electrode is disposed on the first substrate. The organic light emitting layer is disposed on the first electrode. The second electrode is disposed on the organic light emitting layer. The second substrate is located on the second electrode. The material of the second electrode comprises an alkaline earth element and silver. The second electrode comprises a first portion and a second portion, and the first portion is located between the second portion and the first substrate. The ratios of the alkaline earth element to silver in the first portion and in the second portion are different.

16 Claims, 5 Drawing Sheets

(52) U.S. Cl.
CPC ........ *H01L51/5228* (2013.01); *H01L 51/5231* (2013.01); *H01L 51/5237* (2013.01); *H01L 2251/301* (2013.01)

(56) References Cited

U.S. PATENT DOCUMENTS

| | | |
|---|---|---|
| 7,795,806 B2 | 9/2010 | Aziz et al. |
| 7,829,204 B2 | 11/2010 | Iwakuma et al. |
| 8,178,218 B2 | 5/2012 | Funahashi |
| 8,680,563 B2 | 3/2014 | Schlenker et al. |
| 8,872,738 B2 | 10/2014 | Saito et al. |
| 2003/0152801 A1 | 8/2003 | Liao et al. |
| 2006/0052641 A1 | 3/2006 | Funahashi |
| 2006/0261727 A1 | 11/2006 | Aziz et al. |
| 2007/0104976 A1 | 5/2007 | Iwakuma et al. |
| 2007/0155991 A1 | 7/2007 | Funahashi |
| 2009/0195149 A1 | 8/2009 | Funahashi |
| 2010/0123152 A1 | 5/2010 | Sugisawa et al. |
| 2011/0317429 A1* | 12/2011 | Aiba ................... H01L 51/5265 362/296.01 |
| 2014/0027722 A1* | 1/2014 | Lee ....................... H01L 51/524 257/40 |
| 2014/0070199 A1 | 3/2014 | Jung et al. |

FOREIGN PATENT DOCUMENTS

| | | |
|---|---|---|
| TW | I355766 | 1/2012 |
| TW | I364235 | 5/2012 |
| WO | 0057499 | 9/2000 |

OTHER PUBLICATIONS

English Abstract translation of TWI327159 (Published Jul. 11, 2010).
English Abstract translation of TWI364235 (Published May 11, 2012).
English Abstract translation of TWI355766 (Published Jan. 1, 2012).
SIPO Office Action dated Mar. 7, 2016 in corresponding Chinese application (No. 201210472034.1).

* cited by examiner

ORGANIC LIGHT EMITTING DIODE DISPLAY DEVICE AND DISPLAY PANEL THEREOF

This application is a continuation application of U.S. application Ser. No. 14/057,268, filed Oct. 18, 2013, which claims the benefit of People's Republic of China application Serial No. 201210472034.1, filed Nov. 20, 2012, the subject matter of which is incorporated herein by reference.

BACKGROUND

1. Technical Field

The invention relates in general to an organic light emitting diode display device and a display panel thereof, and particularly to the organic light emitting diode display device and the display panel thereof comprising an electrode having two portions, wherein the ratios of an alkaline earth element to silver in the two portions are different.

2. Description of the Related Art

Along with the advances of display technology, various types of display devices have been developed. Organic light emitting diode display devices have become one of the most important research targets of display technology due to light weights, good display properties, and low costs. Therefore, the requirements to the functions and characteristics of organic light emitting diode display devices have gradually increased as well.

Generally, the organic light emitting diode structure of an organic light emitting diode display device is mainly comprised of two electrodes and an organic light emitting layer disposed between the two electrodes. When a voltage is applied on the two electrodes, charge carriers are produced and pass through the organic light emitting layer, and the charge carriers combined produce lights.

However, the electrodes located inside the organic light emitting display device is formed on the light emitting layer made of organic materials. The reliability and luminous efficiency of the whole display device may be influenced due to the poor adhesion between the electrodes and the organic light emitting layer. Therefore, researchers have been working on providing an organic light emitting diode display device with high reliability and great luminous efficiency.

SUMMARY

The invention relates to an organic light emitting diode display device and a display panel thereof. In the organic light emitting diode display panel, with an electrode having two portions, wherein the ratios of an alkaline earth element to silver in the two portions are different, luminous efficiency can be increased, the adhesion between the electrodes and an organic light emitting layer is improved, and the conductivity of the electrodes are increased.

According to an aspect of the present disclosure, an organic light emitting diode (OLED) display panel is provided. The organic light emitting diode display panel comprises a first substrate, a first electrode, an organic light emitting layer, a second electrode, and a second substrate. The first electrode is disposed on the first substrate. The organic light emitting layer is disposed on the first electrode. The second electrode is disposed on the organic light emitting layer. The second substrate is located on the second electrode. The material of the second electrode comprises an alkaline earth element and silver. The second electrode comprises a first portion and a second portion, and the first portion is located between the second portion and the first substrate. The ratios of the alkaline earth element to silver in the first portion and in the second portion are different.

According to another aspect of the present disclosure, an organic light emitting diode display device is provided. The organic light emitting diode display device comprises a case and an organic light emitting diode display panel. The organic light emitting diode display panel is disposed in the case. The organic light emitting diode display panel comprises a first substrate, a first electrode, an organic light emitting layer, a second electrode, and a second substrate. The first electrode is disposed on the first substrate. The organic light emitting layer is disposed on the first electrode. The second electrode is disposed on the organic light emitting layer. The second substrate is located on the second electrode. The material of the second electrode comprises an alkaline earth element and silver. The second electrode comprises a first portion and a second portion, and the first portion is located between the second portion and the first substrate. The ratios of the alkaline earth element to silver in the first portion and in the second portion are different.

The above and other aspects of the disclosure will become better understood with regard to the following detailed description of the non-limiting embodiment(s). The following description is made with reference to the accompanying drawings.

DETAILED DESCRIPTION

In the embodiments of the present disclosure, an organic light emitting diode display device and a display panel thereof are provided. In the organic light emitting diode display panel, with an electrode having two portions, wherein the ratios of an alkaline earth element to silver in the two portions are different, luminous efficiency can be increased, the adhesion between the electrodes and an organic light emitting layer is improved, and the conductivity of the electrodes are increased. The following embodiments are for the purpose of elaboration only, not for limiting the scope of protection of the invention. Detailed structures and processes may be modified or changed by one skilled in the art after having the benefit of this description of the disclosure.

Figure 1:
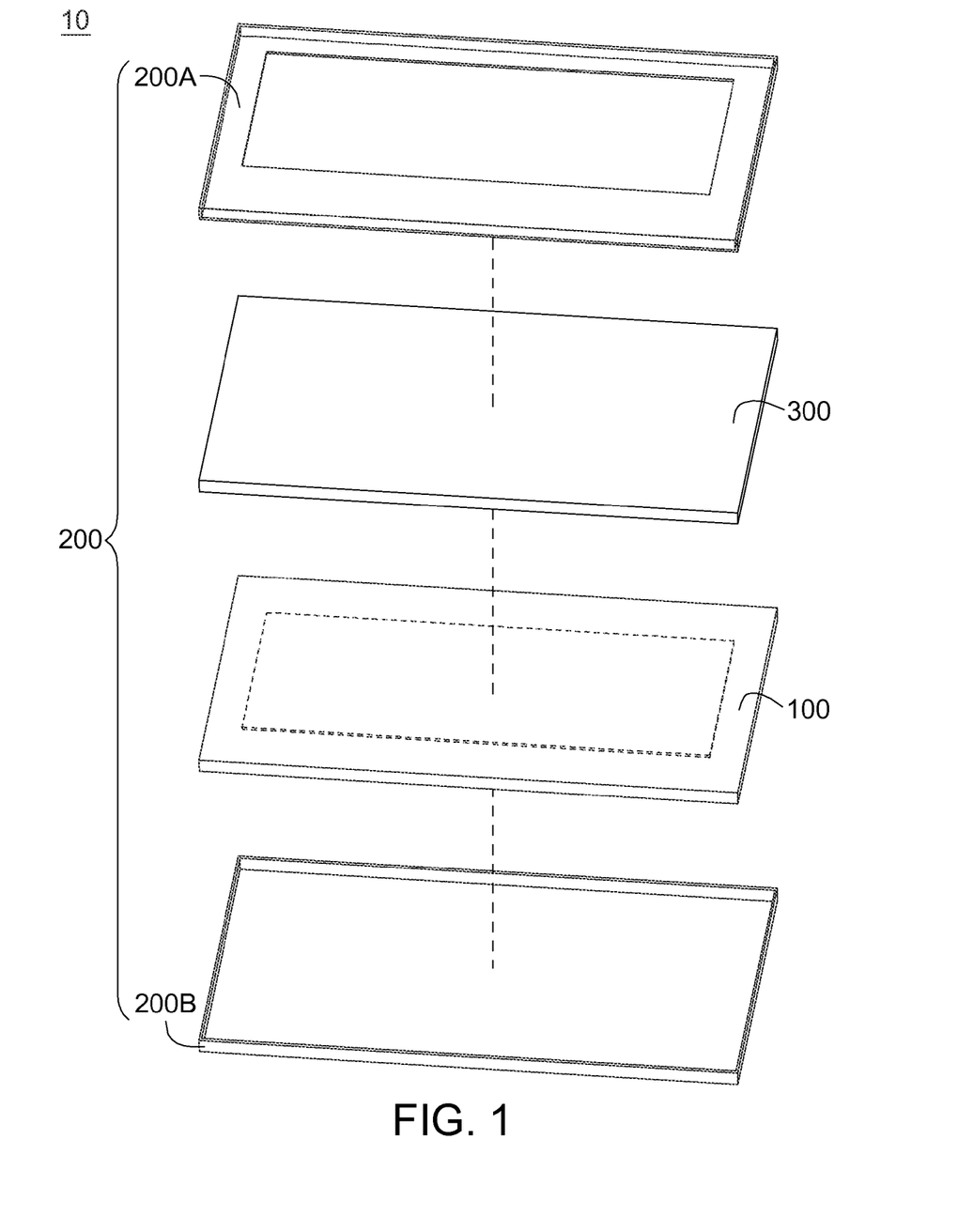
FIG. 1 shows an explosion diagram of an organic light emitting diode display device according to an embodiment of the present disclosure.

Referring to FIG. 1, FIG. 1 shows an explosion diagram of an organic light emitting diode display device 10 according to an embodiment of the present disclosure. As shown in FIG. 1, the organic light emitting diode display device 10 comprises an organic light emitting display panel 100, a case 200, and a front plate 300. The organic light emitting display panel 100 is disposed in the case 200. The organic light emitting display panel 100 is connected to driving units (not shown) for receiving driving signals. The front plate 300 is also disposed in the case 200. The front plate 300 is located between the organic light emitting display panel 100 and observers. The front plate 300 being a transparent cover plate can provide protection, resistance to pressure, and stain resistance. The front plate 300 can further comprise functional structures, such as touch sensors, or barriers or lens for three-dimensional displaying. In the embodiment, as shown in FIG. 1, the case 200 comprises an upper case 200A and a lower case 200B. The organic light emitting display panel 100 and the front plate 300 are disposed between the upper case 200A and the lower case 200B. In other embodiments, the front plate 300 can be removed.

Figure 2:
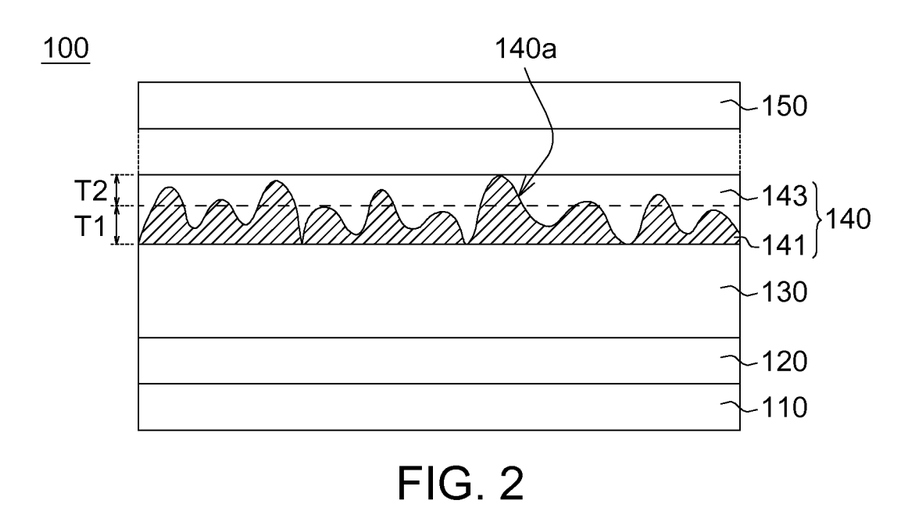
FIG. 2 shows a schematic diagram of the organic light emitting display panel according to an embodiment of the present disclosure.

Referring to FIG. 2, FIG. 2 shows a schematic diagram of the organic light emitting display panel 100 according to an embodiment of the present disclosure. As shown in FIG. 2, the organic light emitting display panel 100 comprises a first substrate 110, a first electrode 120, an organic light emitting layer 130, a second electrode 140, and a second substrate 150. The first electrode 120 regard as anode is disposed on the first substrate 110 and is located between the first substrate 110 and the second substrate 150. The organic light emitting display panel 100 may further comprise additional structures, such as thin film transistors (TFT), conductive lines, capacitors, dielectric layers, pixel definition layers, and etc., between the first substrate 110 and the first electrode 120, and the description of those structures and the driving operations thereof are omitted herein. The organic light emitting layer 130 is disposed on the first electrode 120 and is located between the first electrode 120 and the second substrate 150. The electrodes on two sides of the organic light emitting layer 130 regard as cathode and anode to produce electron-hole pairs with a voltage applied thereon, and the electrons and holes combine in the light emitting layer for emitting lights. The second electrode 140 is disposed on the organic light emitting layer 130 and is located between the organic light emitting layer 130 and the first electrode 120. There is usually a gap between the second substrate 150 and the second electrode 140; however, the second substrate 150 and the second electrode 140 can also be contacted to each other. A capping layer (not shown) can further be disposed on the second electrode 140 to fully cover the first electrode 120, the organic light emitting layer 130, and the second electrode 140 for preventing water and oxygen from passing through, such that the life of the organic light emitting diodes can be prolonged. The first substrate 110 and the second substrate 150 can be sealed with encapsulating materials, such as frits (not shown) or sealants (not shown) connecting the first substrate 110 and the second substrate 150 for enclosing a space, in which space the organic light emitting diodes are disposed. Further, an optical cement adhesive (OCA, not shown) can be filled in the space and occupy part of the space where the organic light emitting diodes do not occupy, such that chances of the organic light emitting diodes being damaged under pressure are reduced. The materials of the first substrate 110 and the second substrate 150 can be glass, plastics, acrylates, ceramics, metals, or the composite structure thereof. The substrate (either the first substrate 110 or the second substrate 150) disposed on the light emitting surface needs to be light transmissive.

In the embodiment, the material of the first electrode 120 comprises a transparent conductive material, such as indium tin oxide (ITO), and silver (or aluminum), and indium tin oxide and silver form a composite stacked structure, such as ITO-Ag-ITO. In the structure, silver can reduce resistance and can be used as a reflective layer. When the first electrode 120 is located on the light emitting surface, the thickness of the silver layer needs to be controlled in order for lights to pass through. The material of the second electrode 140 comprises an alkaline earth element and silver (aluminum may apply as well). In this embodiment, the second electrode 140 is located on the light emitting surface; therefore, the thickness of the second electrode needs to be controlled in order for lights to pass through. The second electrode 140 comprises a first portion 141 and a second portion 143, the ratios of the alkaline earth element to silver in the first portion 141 and in the second portion 143 are different. In the embodiment, as shown in FIG. 2, the first portion 141 of the second electrode 140 is such as located between the second portion 143 of the second electrode 140 and the first substrate 110. In one embodiment, as shown in FIG. 2, the interface 140a between the first portion 141 and the second portion 143 has such as an irregular shape. In another embodiment, the interface between the first portion 141 and the second portion 143 can also be flat (not shown), and the first portion 141 and the second portion 143 are two stacked planar films.

In the embodiment, the organic light emitting layer 130 comprises such as electron transport layer (ETL)/electron injection layer (EIL), emission layer (EML), and hole transport layer (HTL)/hole injection layer (HIL). The emission layer is disposed between the electron transport layer/electron injection layer and the hole transport layer/hole injection layer (not shown).

In the embodiment, the material of the electron transport layer and the material of the electron injection layer comprise, for example, BPhen (4,7-diphenyl-1,10-phenanthroline), Liq (8-hydroxyquinolinolato-lithium), BAlq (Bis(2-methyl-8-quinolinolate)-4-(phenylphenolato)aluminium), TPBi (2,2',2"-(1,3,5-benzinetriyl)-tris(1-phenyl-1-H-benzimidazole), or the combinations thereof. The material of the electron injection layer further comprises lithium (Li) or cesium (Cs) dopants. In the embodiment, the material of the hole transport layer comprises, such as, NPB (N,N'-bis(naphthalen-1-yl)-N,N'-bis(phenyl)-benzidine), TPD (N,N'-bis(3-methylphenyl)-N,N'-bis(phenyl)-benzidine), α-NPD (N,N'-bis(naphthalen-1-yl)-N,N'-bis(phenyl)-2,2'-dimethylbenzidine), or the combinations thereof. In the embodiment, the material of the hole injection layer comprises, such as, HAT-CN (Dipyrazino[2,3f:2',3'-h]quinoxaline-2,3,6,7,10,11-hexacarbonitrile), phthalocyanine copper complex (CuPC), F4-TCNQ (2,3,5,6-tetrafluoro-7,7,8,8-tetracyano-quinodimethane), or the combinations thereof.

In the embodiment, the material of the light emitting layer may comprise fluorescence materials or phosphor materials of red light, green light, or blue light. The red fluorescence material comprises such as a mixture of rubrene and $Alq_3$ (Tris(8-hydroxy-quinolinato)aluminium) as the host material doped with DCJTB dye (4-(dicyanomethylene)-2-tert-butyl-6-(1,1,7,7-tetramethyljulolidin-4-yl-vinyl)-4H-pyran) as the guest material. The red phosphor material comprises such as CBP (4,4'-bis(carbazol-9-yl)biphenyl) and/or TCTA (4,4',4"-Tris(carbazol-9-yl)triphenylamine) as the host material doped with $Ir(piq)_3$ (Tris(1-phenylisoquinoline)indium(III)) and/or $Ir(btp)_2(acac)$ (Bis(2-benzo[b]thiophen-2-yl-pyridine)(acetylacetonate)iridium(III)) as the guest material. The green fluorescence material comprises such as TPBA (2,2'-bi(9,10-diphenyl-anthracene) as the host material doped with C545T (10-(2-Benzothiazolyl)-2,3,6,7-tetrahydro-1,1,7,7-tetramethyl-1H,5H,11H-(1)benzopyropyrano(6,7-8-1,j)quinolizin-11-one) as the guest material. The green phosphor material comprises such as CBP (4,4'-bis(carbazol-9-yl)biphenyl) and/or TCTA (4,4',4"-Tris(carbazol-9-yl)triphenylamine) as the host material doped with $Ir(ppy)_3$ (Tris(2-phenylpyridine)indium(III)) and/or $Ir(ppy)_2(acac)$ (Bis(2- phenylpyridine)(acetylacetonate)indium(III)) as the guest material. The blue fluorescence material comprises such as MADN (2-methyl-9,10-bis(naphthalen-2-yl)anthracene) as the host material doped with DPVABi (4,4'-bis[4-(di-p-tolylamino)styryl]biphenyl) as the guest material. The blue phosphot material comprises such as MCP (1,3-bis(carbazol-9-yl)benzene) and/or UGH-2 (1,4-bis(triphenylsilyl)benzene) as the host material doped with FIrPic (Bis(3,5-difluoro-2-(2-pyridyl)phenyl-(2-carboxypyridyl(iridium(III)) and/or $FIr_6$ (Bis(2,4-difluorophenylpyridinato)tetrakis(1-pyrazolyl)borate indium(III)) as the guest material.

In the embodiment, the first portion 141 of the second electrode 140 has a first thickness T1, and the second portion 143 of the second electrode 140 has a second thickness T2. The above-mentioned thicknesses are the average thicknesses of the corresponding portions. The ratio of the first thickness T1 to the second thickness T2 is, for example, 1:0.5-1:4.

In an embodiment, the ratio of the alkaline earth element to silver in the first portion 141 is larger than the ratio of the alkaline earth element to silver in the second portion 143.

In an embodiment, the alkaline earth element is such as magnesium or silver.

In an embodiment, the first portion 141 is formed of magnesium, and the second portion 143 is formed of silver. In another embodiment, the first portion 141 is formed of magnesium, and the second portion 143 is formed from magnesium and silver. In a further embodiment, the first portion 141 is formed from magnesium and silver, and the second portion 143 is formed of silver. In yet another embodiment, the first portion 141 is formed from magnesium and silver, and the second portion 143 is formed from magnesium and silver.

The lowest unoccupied molecular orbital (LUMO) of the electron transport layer/electron injection layer of the organic light emitting layer 130 has a band gap (energy gap) value of 2.5-3.5 eV, the work function of magnesium is 3.46 eV, and the work function of magnesium-silver alloy if about 3.7 eV. In the embodiment, when the ratio of magnesium to the mixture of magnesium and silver in the first portion 141 is larger than that in the second portion 143, the electron transport layer/electron injection layer of the organic light emitting layer 130 is in direct contact with the first portion 141 of the second electrode 140, and the work function of magnesium is close to the work function (band gap value) of the electron transport layer/electron injection layer, the magnesium content being relatively high in the first portion 141 is advantageous to the transport or injection of electrons, and hence the luminous efficiency is improved.

In addition, the adhesion between pure magnesium and organic films is poor. In the embodiment, the material of the second electrode 140 comprises magnesium and silver, and the existence of silver is beneficial to the adhesion between the second electrode 140 and the organic light emitting layer 130. Moreover, when the size of the organic light emitting diode display panel is relatively large, the wave patterns of driving signals from ends of conductive lines tend to decay more quickly. The existence of silver can increase the conductivity of the second electrode 140, and therefore, the undesired changes of the wave patterns of driving signals are reduced.

In the embodiment, when the first portion 141 is formed from magnesium and silver, the atomic ratio of magnesium to the mixture of magnesium and silver is about between 80% and less than 100% (100%>Mg/(Mg+Ag)≥0%). Preferably, the atomic ratio of magnesium to the mixture of magnesium and silver is about between 90% and less than 100% (100%>Mg/(Mg+Ag)≥90%).

In the embodiment, when the second portion 143 is formed from magnesium and silver, the atomic ratio of magnesium to the mixture of magnesium and silver is about between larger than 0% and 90% (90%≥Mg/(Mg+Ag)>0%). Preferably, the atomic ratio of magnesium to the mixture of magnesium and silver is about between larger than 0% and 80% (80%≥Mg/(Mg+Ag)>0%).

Figure 3:
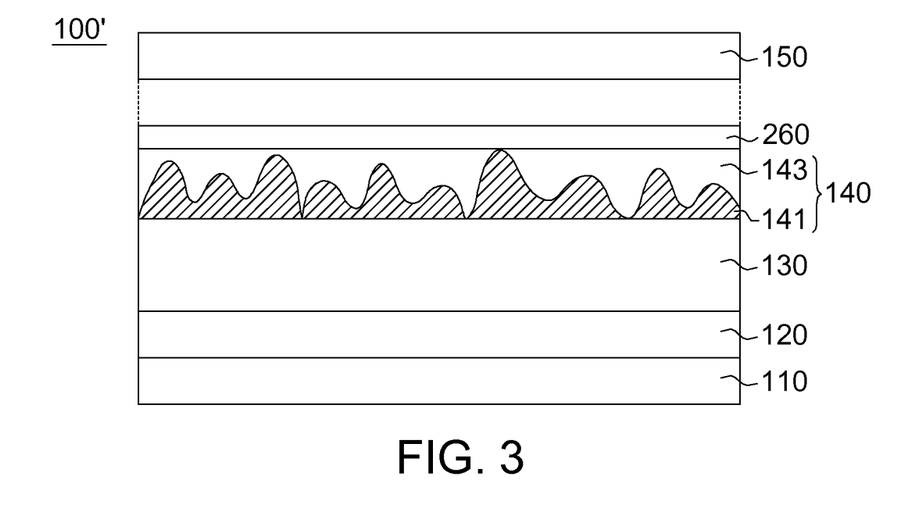
FIG. 3 shows an organic light emitting diode display panel according to another embodiment of the present disclosure.

Referring to FIG. 3, FIG. 3 shows an organic light emitting diode display panel 100' according to another embodiment of the present disclosure. As shown in FIG. 3, the difference between the present embodiment from the embodiment as shown in FIG. 2 is that, the second electrode 140 of the organic light emitting diode display panel 100' further comprises a third portion 260. The third portion 260 is located on the second portion 143. The third portion 260 is located between the second portion 143 and the second substrate 150. The material of the third portion 260 is silver. In the embodiment, when the first portion 141 and the second portion 143 are both formed from magnesium and silver, the silver in the third portion 260 can enhance the electron transport/injection properties of the whole electrode. When the material of the second portion 143 is silver, the third portion 260 can be optionally omitted. The elements in the present embodiment sharing the same labels with those in the previous embodiments are the same elements, and the description of which is omitted.

Figure 4A:
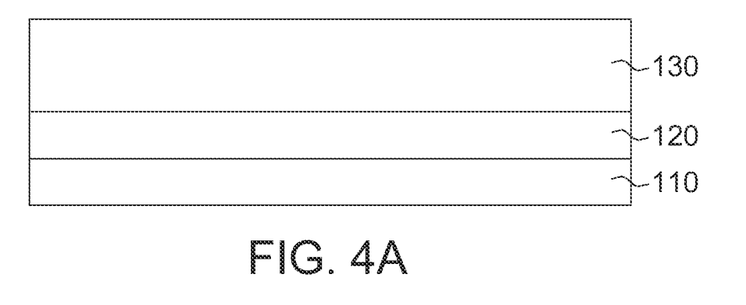
FIGS. 4A-4C illustrate a process for manufacturing an organic light emitting diode display panel according to an embodiment of the present disclosure.
Figure 4B:
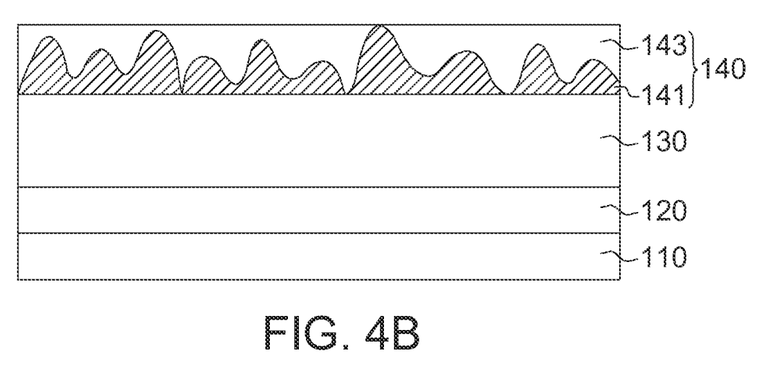
Figure 4C:
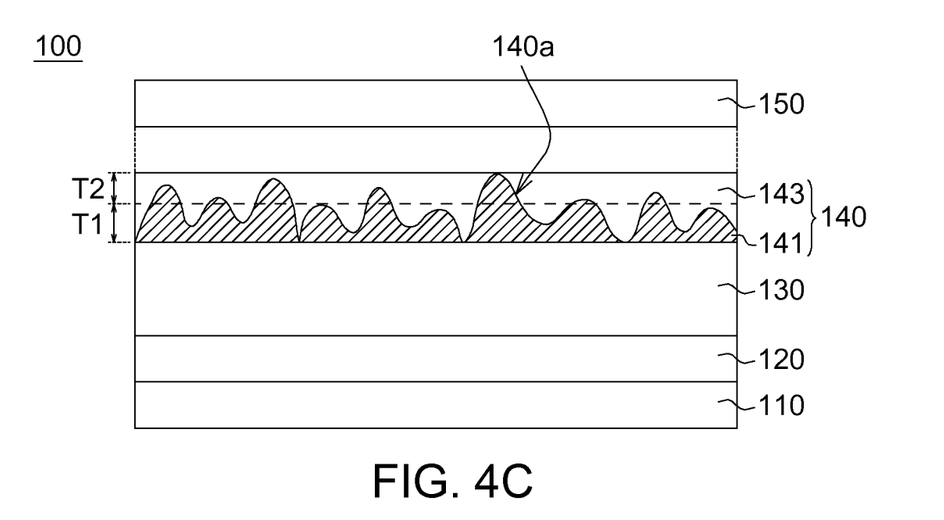

The embodiments disclosed below are for elaborating the manufacturing methods of the organic light emitting diode display panel 100 of the disclosure. However, the descriptions disclosed in the embodiments of the disclosure such as detailed manufacturing procedures are for illustration only, not for limiting the scope of protection of the disclosure. Detailed structures and processes may be modified or changed by one skilled in the art after having the benefit of this description of the disclosure. Referring to FIGS. 4A-4C, FIGS. 4A-4C illustrate a process for manufacturing an organic light emitting diode display panel according to an embodiment of the present disclosure.

Referring to FIG. 4A, the first substrate 110 is provided, the first electrode 120 is formed on the first substrate 110, and the organic light emitting layer 130 is formed on the first electrode 120. The detailed description of processes of manufacturing additional components, such as thin film transistors and conductive lines, are omitted from the description of the above-mentioned steps.

Referring to FIG. 4B, the second electrode 140 is formed on the organic light emitting layer 130. In the embodiment, the second electrode 140 is formed by such as a thermal evaporation process. In the embodiment, the first portion 141 and the second portion 143 of the second electrode 140 are formed in the same thermal evaporation process simultaneously. The ratios of the alkaline earth element to silver in the first portion 141 and in the second portion 143 are different.

In the embodiment, the first portion 141 and the second portion 143 are formed in the same thermal evaporation process. When the silver content in the first portion 141 is higher, in other words, the silver contents in the first portion 141 and in the second portion 143 are closer, the interface 140a between the first portion 141 and the second portion 143 is more indefinite and less distinct, that is to say, the physical interface that can be observed by such as an electron microscopy is less clear. Nevertheless, for example, the first portion 141 and the second portion 143 are two stacked films, an area of the first portion 141 close to the organic light emitting layer 130 and an area of the second portion 143 close to the second substrate 150 still have different ratios of the alkaline earth element to silver.

Referring to FIG. 4C, the second substrate 150 is disposed on the second substrate 150. As such, the organic light emitting diode display panel 100 as shown in FIG. 4C (FIG. 2) is formed.

Figure 5A:
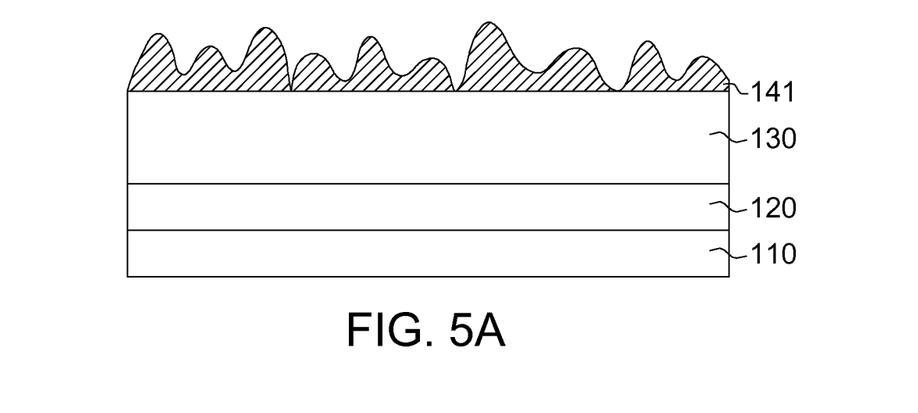
FIGS. 5A-5B illustrate a process of an organic light emitting diode display panel according to another embodiment of the present disclosure.
Figure 5B:
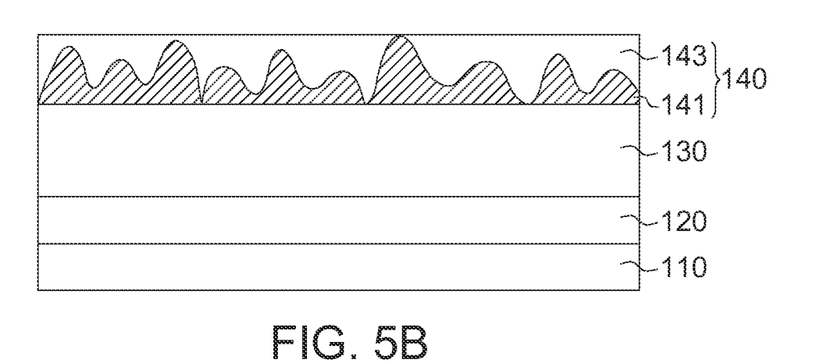

FIGS. 5A-5B illustrate a process of an organic light emitting diode display panel according to another embodiment of the present disclosure. Please refer to FIG. 4 and FIGS. 5A-5B.

First, the structure as shown in FIG. 4A is formed. Next, as shown in FIG. 5A, the first portion 141 of the second electrode 140 is formed on the organic light emitting layer 130. In the embodiment, the first portion 141 of the second electrode 140 is formed by such as a thermal evaporation process. The magnesium content in the first portion 141 is relatively high, and thus, an irregular structure as shown in FIG. 5A may be formed, and the first portion 141 has a surface of an irregular shape.

Next, as shown in FIG. 5B, the second portion 143 of the second electrode 140 is formed on the first portion 141. In the embodiment, the second portion 143 of the second electrode 140 is formed by such as a thermal evaporation process. The silver content in the second portion 143 is relatively high, and thus, the film formation is greater, such that the second electrode 140 can be formed with a flat surface. Moreover, the adhesion between the second electrode 140 and the organic light emitting layer 130 is increased.

Next, as shown in FIG. 4C, the second substrate 150 is disposed on the second electrode 140. As such, the organic light emitting diode display panel 100 as shown in FIG. 2 is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
a first substrate;
a second substrate;
a first electrode disposed between the first substrate and the second substrate;
an organic light emitting layer disposed between the first electrode and the second substrate; and
a second electrode disposed between the organic light emitting layer and the second substrate,
wherein a material of the second electrode comprises an alkaline earth element and silver;
wherein the second electrode comprises a first point, a second point, and a third point, a distance between the organic light emitting layer and the first point is less than a distance between the organic light emitting layer and the second point, the distance between the organic light emitting layer and the first point is less than a distance between the organic light emitting layer and the third point, and the distance between the second point and the organic light emitting layer is different from the distance between the third point and the organic light emitting layer; and
wherein a ratio of the alkaline earth element to silver of the first point is greater than a ratio of the alkaline earth element to silver of the second point, and the ratio of the alkaline earth element to silver of the first point is greater than a ratio of the alkaline earth element to silver of the third point.

2. The display panel according to claim 1, further comprising a capping layer disposed between the second substrate and the second electrode.

3. The display panel according to claim 2, wherein the second electrode is between the capping layer and the organic light emitting layer.

4. The display panel according to claim 2, wherein a distance between the capping layer and the second point is less than a distance between the capping layer and the first point.

5. The display panel according to claim 1, wherein a thickness of the first electrode is greater than a thickness of the second electrode.

6. The display panel according to claim 1, wherein the alkaline earth element comprises magnesium (Mg).

7. The display panel according to claim 1, wherein a material of the third point of the second electrode comprises silver.

8. A display panel, comprising:
a first substrate;
a second substrate;
a first electrode disposed between the first substrate and the second substrate;
an organic light emitting layer disposed between the first electrode and the second substrate; and
a second electrode disposed between the organic light emitting layer and the second substrate, the second electrode comprising at least one irregular interface and a first region, the irregular interface disposed within the second electrode, the first region disposed between the organic light emitting layer and the irregular interface,
wherein a material of the second electrode comprises an alkaline earth element and silver;
wherein a ratio of the alkaline earth element to silver at the irregular interface is less than a ratio of the alkaline earth element to silver of the first region.

9. The display panel according to claim 8, the second electrode further comprising a second region, the irregular interface disposed between the first region and the second region, and the ratio of the alkaline earth element to silver at the irregular interface is less than a ratio of the alkaline earth element to silver of the second region.

10. The display panel according to claim 9, wherein the ratio of the alkaline earth element to silver of the first region is greater than the ratio of the alkaline earth element to silver of the second region.

11. The display panel according to claim 8, wherein silver is dominant in the mixture of the alkaline earth element and silver of the irregular interface.

12. The display panel according to claim 8, further comprising a capping layer disposed between the second substrate and the second electrode.

13. The display panel according to claim 12, wherein the second electrode is between the capping layer and the organic light emitting layer.

14. The display panel according to claim 8, wherein a thickness of the first electrode is greater than a thickness of the second electrode.

15. The display panel according to claim 8, wherein the alkaline earth element comprises magnesium (Mg).

16. The display panel according to claim 8, further comprising a third electrode disposed between the second electrode and the second substrate, wherein a material of the third electrode comprises silver.

* * * * *